United States Patent [19]

Uetani

[11] Patent Number: 5,130,225
[45] Date of Patent: Jul. 14, 1992

[54] POSITIVE RESIST COMPOSITION COMPRISING A CYCLIC DIMER OF ISOPROPENYL PHENOL, ALSO KNOWN AS A 1,1,3 TRIMETHYL-3-HYDROXYPHENYL INDANE

[75] Inventor: Yasunori Uetani, Toyonaka, Japan

[73] Assignee: Sumitomo Chemical Co. Ltd., Osaka, Japan

[21] Appl. No.: 696,083

[22] Filed: May 6, 1991

[30] Foreign Application Priority Data

May 24, 1990 [JP] Japan ................... 2-136501

[51] Int. Cl.⁵ ............... G03F 7/022; G03F 7/023
[52] U.S. Cl. .................... 430/191; 430/192; 430/193
[58] Field of Search ........... 430/191, 192, 193, 165; 568/720, 270

[56] References Cited

U.S. PATENT DOCUMENTS

| 3,288,864 | 11/1966 | Farnham | 568/270 |
| 4,245,128 | 1/1981 | Kato et al. | 428/415 |
| 4,366,328 | 12/1982 | Numata et al. | 568/734 |
| 4,626,492 | 12/1986 | Eilbeck | 430/191 |
| 4,696,886 | 9/1987 | Hanabata et al. | 430/192 |

FOREIGN PATENT DOCUMENTS 1-53292  11/1989  Japan .

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive resist composition comprising an alkali-soluble resin, a quinone diazide compound and a specific hydroxyl group-containing compound can improve sensitivity without deterioration of heat resistance and film thickness retention.

19 Claims, No Drawings

POSITIVE RESIST COMPOSITION COMPRISING A CYCLIC DIMER OF ISOPROPENYL PHENOL, ALSO KNOWN AS A 1,1,3 TRIMETHYL-3-HYDROXYPHENYL INDANE

BACKGROUND OF THE INVENTION

1. Field of the Invention

The present invention relates to a radiation-sensitive resist composition which is excellent in sensitivity, heat resistance and film thickness retention.

2. Description of the Related Art

A radiation-sensitive resist composition containing a compound having a quinone diazide group finds use as a positive resist, because upon exposure to light having a wavelength of not longer than 500 nm, the quinone diazide group decomposes to form a carboxyl group whereby the originally alkali-insoluble composition becomes alkali-soluble. The positive resist composition has much better resolution than a negative resist composition and is used in the production of integrated circuits such as IC or LSI.

Recently, particularly in the production of integrated circuits, miniaturization has proceeded as the integration level has increased, which results in demands for formation of patterns of submicron order. According to conventional processes for the production of integrated circuits, light exposure is accomplished by placing a mask in intimate contact to a substrate, e.g. a silicon wafer. It is said that this process cannot make patterns thinner than 2 μm. Instead of such conventional processes, the reduction projection in exposure system attracts attention. According to this new system, a pattern of a master mask (reticle) is projected on the substrate with reduction by a lens system, whereby exposure is accomplished. This system realizes a resolving power of submicron.

One of the serious problems in this system is low throughput. Namely, in this system, the total exposure time to expose a wafer is very long because of divided and repeated light exposure unlike a batch light exposure system which is employed in the conventional mask contact printing methods.

To solve this problem, not only an improvement in the apparatus but also an increase in sensitivity of the resist to be used are important.

To increase the sensitivity, it is easiest to decrease molecular weights of a quinone diazide compound and an alkali-soluble resin, in particular, a novolak resin used in the positive photoresist. The decrease of the alkali-soluble resin molecular weight accelerates dissolution of the photoresist in an alkaline developer so that the apparent sensitivity of the photoresist is increased.

This method, however, has very serious disadvantages such as large film thickness loss in an unexposed area (reduction of so-called film thickness retention), worsening a shape of the pattern, and decrease of the γ-value, namely decrease of resolution because of small difference in the dissolving rates in the developing solution between the exposed area and the unexposed area. In addition, when the alkali-soluble resin has a low molecular weight, the resist composition has low heat resistance.

Other measures to increase the sensitivity of the resist are prolongation of a developing time and increase of an alkali concentration in a developing solution. By these measures, though the apparent sensitivity of the photoresist is increased because of increase of solubility of the resist in the developing solution, the film thickness retention is deteriorated, which results in decrease of resolution.

In general, it is impossible to improve the sensitivity while maintaining heat resistance and the film thickness retention, and vice versa.

SUMMARY OF THE INVENTION

An object of the present invention is to provide a positive resist composition which has better sensitivity without deterioration of heat resistance and film thickness retention.

The present invention is based on the finding that, when a compound of the following general formula is present in a positive resist composition, the sensitivity can be much improved without deterioration of heat resistance and film thickness retention.

According to the present invention, there is provided a positive resist composition comprising an alkali-soluble resin, a quinone diazide compound as a radiation-sensitive component and a compound of the formula:

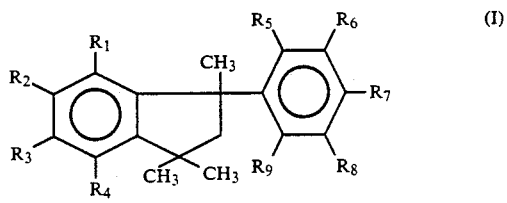

wherein $R_1$ to $R_9$ are the same or different and are independently a hydrogen atom, an alkyl group, a halogen atom or a hydroxyl group, provided that at least one of $R_1$ to $R_9$ is a hydroxyl group.

DETAILED DESCRIPTION OF THE INVENTION

As the alkyl group for $R_1$ to $R_9$, a straight or branched $C_1$-$C_4$ alkyl group is preferred. Preferred examples of the alkyl group are a methyl group and an ethyl group. Examples of the halogen atom are a fluorine atom, a chlorine atom, a bromine atom and an iodine atom.

The compound (I) may be synthesized from m- or p-isopropenylbenzene or its linear dimer by a method disclosed in U.S. Pat. No. 3,288,864 the disclosure of which is hereby incorporated by reference.

Specific examples of the compound (I) are as follows:

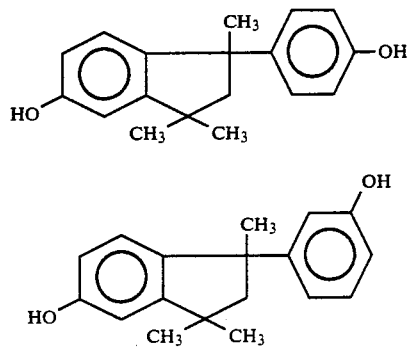

-continued

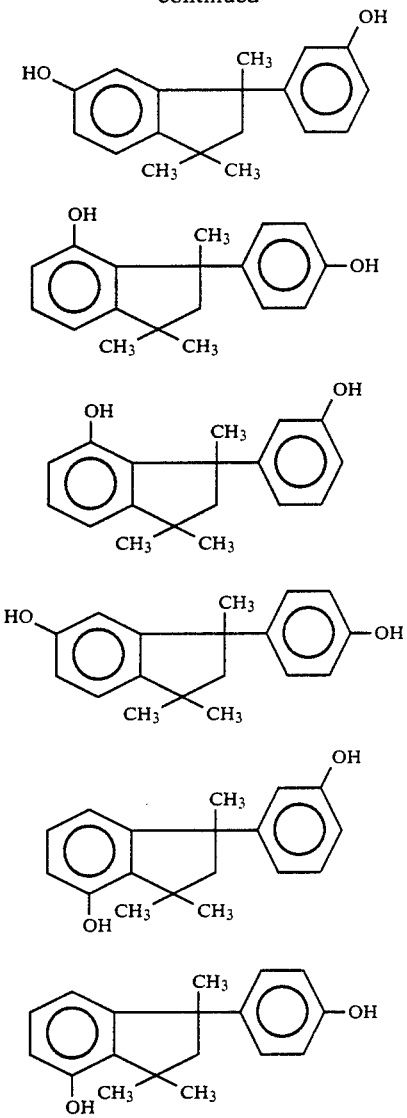

The compounds (I) may be used independently or as a mixture.

As the radiation-sensitive component, a quinone diazide compound is used. The quinone diazide compound is prepared by a conventional method, for example, by a condensation reaction of naphthoquinone diazide sulfonyl chloride or benzoquinone diazide sulfonly chloride (e.g. naphthoquinone-(1,2)-diazide-(2)-5-sulfonyl chloride, naphthoquinone-(1,2)-diazide-(2)-4-sulfonyl chloride or benzoquinone-(1,2)-diazide-(2)-4-sulfonyl chloride) with a compound having a hydroxyl group in the presence of a weak alkali.

Examples of the compound having a hydroxyl group are hydroquinone, resorcinol, phloroglucin, 2,4-dihydroxybenzophenone, trihydroxybenzophenones (e.g. 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2',3,4-trihydroxybenzophenone, 3,3',4trihydroxybenzophenone, 3,4,4' -trihydroxybenzophenone, etc.), tetrahydroxybenzophenones (e.g. 2,3,3',4-tetrahydroxybenzophenone, 2,3,4,4'-tetrahydroxybenzophenone, 2,2',4,4'-tetrahydroxybenzophenone, 2,2',3,4- tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4pentahydroxybenzophenone, 2,3,3',4,5'-pentahydroxybenzophenone, etc.), hexahydroxybenzophenones (e.g. 2,3,3',4,4',5'-hexahydroxybenzophenone, 2,2',3,3',4,5'-hexahydroxybenzophenone, etc.), alkyl gallates, and hydrofuran compounds such as a compound of the formula:

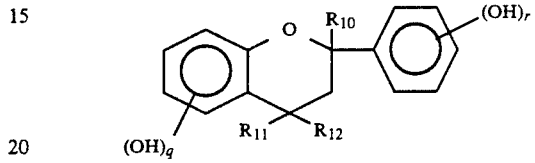

wherein q is a number of 0 to 4, r is a number of 1 to 5, provided that a sum of q and r is 2 or larger, $R_{10}, R_{11}$ and $R_{12}$ are respective atom, an alkyl group, an alkenyl group, a cyclohexyl group or an aryl group.

Examples of the alkali-soluble resin are novolak resins prepared by reacting a phenol compound with an aldehyde such as formalin.

Examples of the phenol compound which is used as one of the raw materials of the novolak resin are phenol, cresol, xylenol, ethylphenol, trimethylphenol, propylphenol, methylbutylphenol, butylphenol, dihydroxybenzene, naphthols and so on. They may be used alone or as a mixture.

Among the phenol compounds, cresols are preferred. In this case, m-cresol alone may be used, although a mixture of m-cresol and p-cresol may be used. That is, cresols can be used in a ratio of m-cresol to p-cresol of from 100:0 to 30:70.

Examples of the aldehyde which is used in the addition condensation reaction with the phenol compound are an aqueous solution of formaldehyde (formalin) and paraformaldehyde. In particular, 37% formalin which is commercially mass produced is suitably used.

The addition condensation reaction of the phenol compound and formaldehyde is carried out by a conventional method. The reaction is usually carried out at a temperature of 60 to 120° C. for 2 to 30 hours.

As a catalyst, any of conventionally used organic acids, inorganic acid and divalent metal salts can be used. Specific examples of the acid catalyst are oxalic acid, hydrochloric acid, sulfuric acid, perchloric acid, p-toluenesulfonic acid, trichloroacetic acid, phosphoric acid, formic acid, zinc acetate, magnesium acetate, etc.

The condensation reaction may be carried out in the presence or absence of a solvent.

A preferred molecular weight of the alkali-soluble resin varies with a mixing ratio of the phenol compound, the kind of catalyst and the reaction condition. Usually, the alkali-soluble resin has a weight average molecular weight (Mw) of 2000 to 50,000, preferably 3000 to 30,000 as measured by gel permeation chromatography (GPC).

In particular, when a molecular weight is measured by GPC with a UV light (254 nm) detector, more preferably the alkali-soluble resin shows an area ratio of a range in which the molecular weight calculated as polystyrene is not larger than 900 to the whole GPC pattern area of not exceeding 25%.

In this range, the positive resist composition has excellent heat resistance and no developing residue.

The alkali-soluble resin characterized as above is obtained through fractionation and the like after the condensation reaction.

For example, the synthesized alkali-soluble resin is dissolved in a good solvent such as alcohols (e.g. methanol and ethanol), ketones (e.g. acetone, methyl ethyl ketone, methyl isobutyl ketone, etc.), ethylene glycol and its ethers or ether esters (e.g. ethylcellosolve, ethylcellosolve acetate, etc.), tetrahydrofuran and then precipitated. Alternatively, a synthesized alkali-soluble resin is poured in heptane, hexane, pentane, cyclohexane and the like to fractionate it.

An amount of the compound (I) to be added to the resist composition is preferably from 5 to 20% by weight based on the total weight of the solid components in the resist composition.

The positive resist composition is prepared by mixing and dissolving the above quinone diazide compound, the alkali-soluble resin and the compound (I) in a solvent. A weight ratio of the alkali-soluble resin to the quinone diazide compound is preferably from 1:1 to 1:6.

Preferably, the used solvent evaporates at a suitable drying rate to give a uniform and smooth coating film. Examples of such solvent are ethylcellosolve acetate, methylcellosolve acetate, ethylcellosolve, methylcellosolve, propyleneglycol monomethyl ether acetate, butyl acetate, methyl isobutyl ketone, xylene, etc. In case of ethylcellosolve acetate, the solvent is used in an amount of 30 to 80% by weight of the all solvent weight.

To the positive photoresist composition obtained by the foregoing method, small amounts of resins, dyes, etc. may be added if desired.

The resist composition of the present invention has improved sensitivity, heat resistance and the film thickness retention and is useful as a resist composition for KrF excimer laser.

PREFERRED EMBODIMENTS OF THE INVENTION

The present invention will be illustrated more in detail with the following Examples, but it is not limited to these Examples. In Examples, "parts" are by weight unless otherwise indicated.

EXAMPLES 1-4 AND COMPARATIVE EXAMPLES 1-3

The compound of the formula:

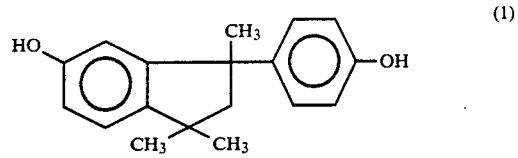

(p-OST Cyclic Dimer manufactured by Mitsui Toatsu) was dissolved in ethylcellosolve acetate (48 parts) together with a novolak resin and a quinone diazide compound in a composition shown in the Table.

The resulting solution was filtered through a Teflon (trademark) filter of 0.2 μm in pore size to obtain a resist solution. The solution was then coated on a silicon wafer, which had been rinsed in a usual manner, by means of a spinner to form a resist film of 1.3 μm in thickness. The coated silicon wafer was baked for 60 seconds on a hot plate kept at 100° C. and exposed to light having a wavelength of 436 nm (g line) while varying the exposure time stepwise by means of a reduction projection exposure apparatus (DSW 4800 with NA=0.28 manufactured by GCA). Thereafter, the silicon wafer was developed in a developer (SOPD (trade name) manufactured by Sumitomo Chemical Company, Limited) to obtain a positive pattern.

The remaining film thicknesses of the resist were plotted against the exposure time to calculate sensitivity. The film thickness retention was calculated from the remaining film thickness in the unexposed area. Also, the silicon wafer having a resist pattern was placed for 3 minutes on a direct hot plate set at various temperatures, and the heat resistance was evaluated by observing occurrence of thermal deformation of a line and space pattern of 3 μm by means of a scanning electron microscope. The results are shown in the Table.

TABLE

| Example No. | Resist composition | | | Resist properties | | |
|---|---|---|---|---|---|---|
| | Novolak[1] resin (parts) | Quinone diazide[2] compound (parts) | Compound (I) (parts) | Sensitivity[3] (msec) | Film thickness retension (%) | Heat resistance[4] (°C.) |
| 1 | A (17) | C (6) | 2 | 190 | 97 | 150 |
| 2 | B (17) | ↑ | 3 | 150 | 96 | 140 |
| 3 | B (17) | D (5) | 4 | 290 | 99 | 130 |
| 4 | B (17) | ↑ | 6 | 180 | 98 | 120 |
| C. 1 | A (17) | C (6) | — | 250 | 96 | 150 |
| C. 2 | B (17) | ↑ | — | 290 | 95 | 140 |

TABLE-continued

| C. 3 | B (17) | D (5) | — | 1600 | 98 | 130 |
| --- | --- | --- | --- | --- | --- | --- |

Note:
*[1] Novolak A:
A cresol mixture (the molar ratio of m-isomer to p-isomer = 6:4) was reacted with formalin (the molar ratio of the cresols to formalin = 1:0.8) were reacted in the presence of oxalic acid as a catalyst under reflux to obtain a novolak resin of 13,000 in a weight average molecular weight calculated as polystyrene.
Novolak B:
A cresol novolak resin which was prepared by reacting formalin and a cresol mixture (the molar ratio of m-isomer to p-isomer = 5:5) in a ratio of 0.8:1 using oxalic acid as a catalyst and had an area ratio of a range in which the molecular weight as converted to polystyrene is not larger than 900 in the GPC pattern being 23.5% and the weight average molecular weight of 8000 calculated as polystyrene.
*[2] Quinone diazide compound C:
A condensation product of naphthoquinone-(1,2)-diazide-(2)-5-sulfonyl chloride and 2,3,4,4'-tetrahydroxybenzophenone in a molar ratio of 2.7:1.
Quinone diazide compound D:
A condensation product of naphthoquinone-(1,2)-diazide-(2)-5-sulfonyl chloride and a compound of the formula:

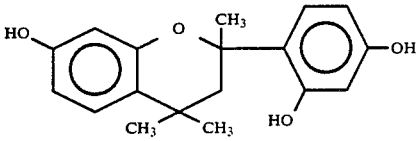

in a molar ratio of 2.5:1.
*[3] A minimum exposure time (msec) at which the film thickness of the resist became zero.
*[4] A temperature at which the line and space pattern of 3 μm started to thermally decompose.

What is claimed is:

1. A positive resist composition comprising in admixture an alkali-soluble resin, a quinone diazide compound as a radiation-sensitive component and a compound of the formula:

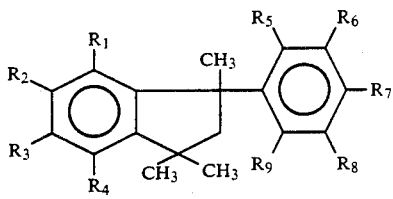

wherein $R_1$ to $R_9$ are the same or different, are independently a hydrogen atom, an alkyl group, a halogen atom or a hydroxyl group, provided that at least one of $R_1$ to $R_9$ is a hydroxyl group.

2. The positive resist composition according to claim 1, wherein said alkali-soluble resin has an area ratio of a range in which the molecular weight calculated as polystyrene is not larger than 900 to the whole GPC pattern area of not exceeding 25% when a molecular weight is measured by GPC with a UV light (254 nm) detector.

3. The positive resist composition according to claim 1, wherein $R_1$ to $R_9$ are the same or different, and are independently a hydrogen atom, a $C_1$-$C_4$ alkyl group, a halogen atom or a hydroxyl group, provided that at least one of $R_1$ to $R_9$ is a hydroxyl group.

4. The positive resist composition according to claim 1, wherein $R_1$ to $R_9$ are the same or different, and are independently a hydrogen atom, a $C_1$-$C_4$ alkyl group, or a hydroxyl group, provided that at least one of $R_1$ to $R_9$ is a hydroxyl group.

5. The positive resist composition according to claim 1, wherein $R_1$ to $R_9$ are the same or different, and are independently a hydrogen atom, a methyl group, an ethyl group, a halogen atom or a hydroxyl group, provided that at least one of $R_1$ to $R_9$ is a hydroxyl group.

6. The positive resist composition according to claim 1, wherein $R_1$ to $R_9$ are the same or different, and are independently a hydrogen atom, a methyl group, an ethyl group, or a hydroxyl group, provided that at least one of $R_1$ to $R_9$ is a hydroxyl group.

7. The positive resist composition according to claim 1, wherein $R_1$ to $R_9$ are the same or different, and are independently a hydrogen atom, a methyl group, an ethyl group, a halogen atom or a hydroxyl group, provided that at least one of $R_1$ to $R_9$ is a hydroxyl group.

8. The positive resist composition according to claim 1, wherein $R_1$ to $R_9$ are the same or different, and are independently a hydrogen atom, a methyl group, or a hydroxyl group, provided that at least one of $R_1$ to $R_9$ is a hydoxyl group.

9. The positive resist composition according to claim 1, wherein said halogen atom is selected from the group consisting of a fluorine atom, a chlorine atom, a bromine atom and an iodine atom.

10. The positive resist composition according to claim 1, wherein the compound of formula (I) is

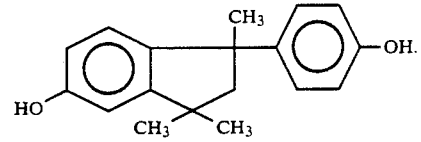

11. The positive resist composition according to claim 1, wherein the compound of formula (I) is

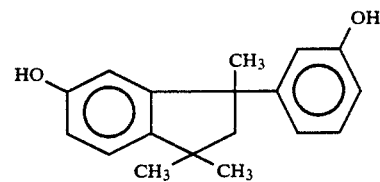

12. The positive resist composition according to claim 1, wherein the compound of formula (I) is

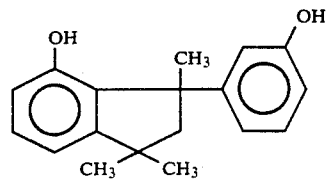

13. The positive resist composition according to claim 1, wherein the compound of formula (I) is

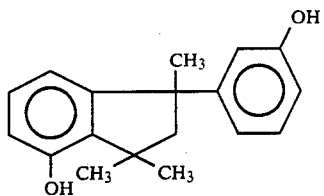

14. The positive resist composition according to claim 1, wherein the compound of formula (I) is

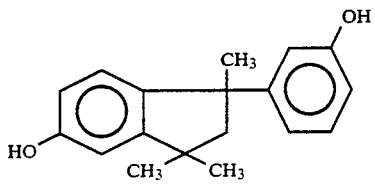

15. The positive resist composition according to claim 1, wherein the compound of formula (I) is

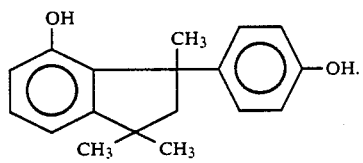

16. The positive resist composition according to claim 1, wherein the compound of formula (I) is

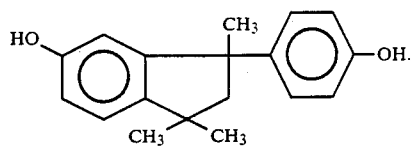

17. The positive resist composition according to claim 1, wherein the compound of formula (I) is

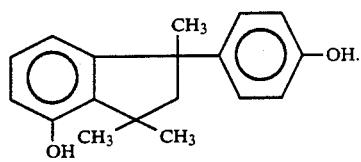

18. The positive resist composition according to claim 1, wherein said quinone diazide compound is prepared by a condensation reaction of naphthoquinone diazide sulfonyl chloride or benzoquinone diazide sulfonyl chloride with a compound having a hydroxyl group in the presence of a weak alkali.

19. The positive resist composition according to claim 18, wherein said naphthoquinone diazide sulfonyl chloride or benzoquinone diazide sulfonyl chloride compounds are selected from the group consisting of naphthoquinone-(1,2-diazide-(2)-5-sulfonyl chloride, naphthoquinone-(1,2)-diazide-(2)-4-sulfonyl chloride, and benzoquinone-(1,2)-diazide-(2)-4-sulfonyl chloride.

* * * * *